US010488549B2

(12) United States Patent
Kare et al.

(10) Patent No.: US 10,488,549 B2
(45) Date of Patent: Nov. 26, 2019

(54) LOCATING POWER RECEIVERS (71) Applicant: LASERMOTIVE, INC., Kent, WA (US)

(72) Inventors: Jordin T. Kare, San Jose, CA (US); Thomas J. Nugent, Jr., Bellevue, WA (US); Carsten Casey Erickson, Kent, WA (US)

(73) Assignee: LaserMotive, Inc., Kent, WA (US)

( * ) Notice: Subject to any disclaimer, the term of this patent is extended or adjusted under 35 U.S.C. 154(b) by 0 days.

(21) Appl. No.: 15/574,667

(22) PCT Filed: May 18, 2016

(86) PCT No.: PCT/US2016/033156
§ 371 (c)(1),
(2) Date: Nov. 16, 2017

(87) PCT Pub. No.: WO2016/187357
PCT Pub. Date: Nov. 24, 2016

(65) Prior Publication Data
US 2018/0123403 A1 May 3, 2018

Related U.S. Application Data (60) Provisional application No. 62/163,307, filed on May 18, 2015.

(51) Int. Cl.
H02J 50/90 (2016.01)
H04B 10/80 (2013.01)
(Continued)

(52) U.S. Cl.
CPC ............... G01V 8/22 (2013.01); G01S 7/003 (2013.01); G01S 7/006 (2013.01); G01S 7/484 (2013.01);
(Continued)

(58) Field of Classification Search
CPC .. G01V 8/14; H02J 50/80; H02J 50/90; G01S 7/003
See application file for complete search history.

(56) References Cited

U.S. PATENT DOCUMENTS 4,168,908 A * 9/1979 Cubalchini ............. G01S 17/66
250/203.1
5,771,114 A 6/1998 Andersson et al.
(Continued)

FOREIGN PATENT DOCUMENTS

EP 1 469 617 A2 10/2004
EP 1 469 619 A2 10/2004
WO 2007/036937 A2 4/2007

OTHER PUBLICATIONS

International Search Report, dated Jul. 20, 2016, for International Application No. PCT/US2016/033156, 4 pages.
(Continued)

Primary Examiner — An T Luu
(74) Attorney, Agent, or Firm — Seed IP Law Group LLP (57) ABSTRACT A power beaming system includes a power beam reception unit and a power beam transmission unit. The power beam reception unit includes a power conversion array, such as a photovoltaic array, arranged to capture at least a portion of a power beam, and a power supply circuit arranged to convert flux from the captured portion of the power beam to electric power. The power beam transmission unit includes a power beam transmitter circuit to transmit a low-flux search beam during a first time window, and further arranged to transmit a high-flux power beam during a second time window. The power beam transmission unit also includes a location detection circuit arranged to identify a location of the reception unit based on the power beam transmitter circuit transmitting the low-flux search beam during the first time window.

20 Claims, 6 Drawing Sheets (51) Int. Cl.

| | | |
|---|---|---|
| *G01V 8/22* | (2006.01) | |
| *G01S 17/02* | (2006.01) | |
| *G01S 17/87* | (2006.01) | |
| *G01S 17/88* | (2006.01) | |
| *G01S 7/00* | (2006.01) | |
| *G01S 7/484* | (2006.01) | |
| *H01S 5/00* | (2006.01) | |
| *H01S 5/062* | (2006.01) | |
| *H01S 5/42* | (2006.01) | |
| *H02J 50/60* | (2016.01) | |
| *H02J 50/30* | (2016.01) | |
| *H04B 10/114* | (2013.01) | |
| *H02J 50/10* | (2016.01) | |
| *G01S 17/89* | (2006.01) | |
| *G01S 17/06* | (2006.01) | |

(52) U.S. Cl.
CPC ............ *G01S 17/026* (2013.01); *G01S 17/06* (2013.01); *G01S 17/87* (2013.01); *G01S 17/88* (2013.01); *G01S 17/89* (2013.01); *H01S 5/005* (2013.01); *H01S 5/0085* (2013.01); *H01S 5/06216* (2013.01); *H01S 5/423* (2013.01); *H02J 50/10* (2016.02); *H02J 50/30* (2016.02); *H02J 50/60* (2016.02); *H02J 50/90* (2016.02); *H04B 10/1141* (2013.01); *H04B 10/807* (2013.01)

(56) References Cited

U.S. PATENT DOCUMENTS

| | | | |
|---|---|---|---|
| 6,633,026 B2* | 10/2003 | Tuominen | H02J 17/00 250/205 |
| 7,068,991 B2* | 6/2006 | Parise | B01F 5/0614 455/343.1 |
| 9,837,859 B2* | 12/2017 | Hiebl | H02J 17/00 |
| 9,838,143 B2 | 12/2017 | Chan et al. | |
| 9,912,379 B2 | 3/2018 | Hyde et al. | |
| 2002/0046763 A1* | 4/2002 | Berrios | H02J 7/35 136/244 |
| 2006/0266917 A1* | 11/2006 | Baldis | H01Q 1/248 250/200 |
| 2010/0079005 A1 | 4/2010 | Hyde et al. | |

OTHER PUBLICATIONS

International Search Report, dated Nov. 4, 2016, for International Application No. PCT/US2016/033086, 5 pages.

\* cited by examiner

LOCATING POWER RECEIVERS

CROSS-REFERENCE TO RELATED APPLICATION

This application claims the benefit under 35 U.S.C. § 119(e) of U.S. Provisional Patent Application No. 62/163,307, filed on May 18, 2015, entitled "Provisional Patents for Wireless Power" which is hereby incorporated by reference in its entirety.

BACKGROUND

Technical Field

The present disclosure generally relates to power beaming technology. More particularly, but not exclusively, the present invention relates to locating a power receiver toward which a power transmitter will transmit a power beam.

Description of the Related Art

Figure 1:
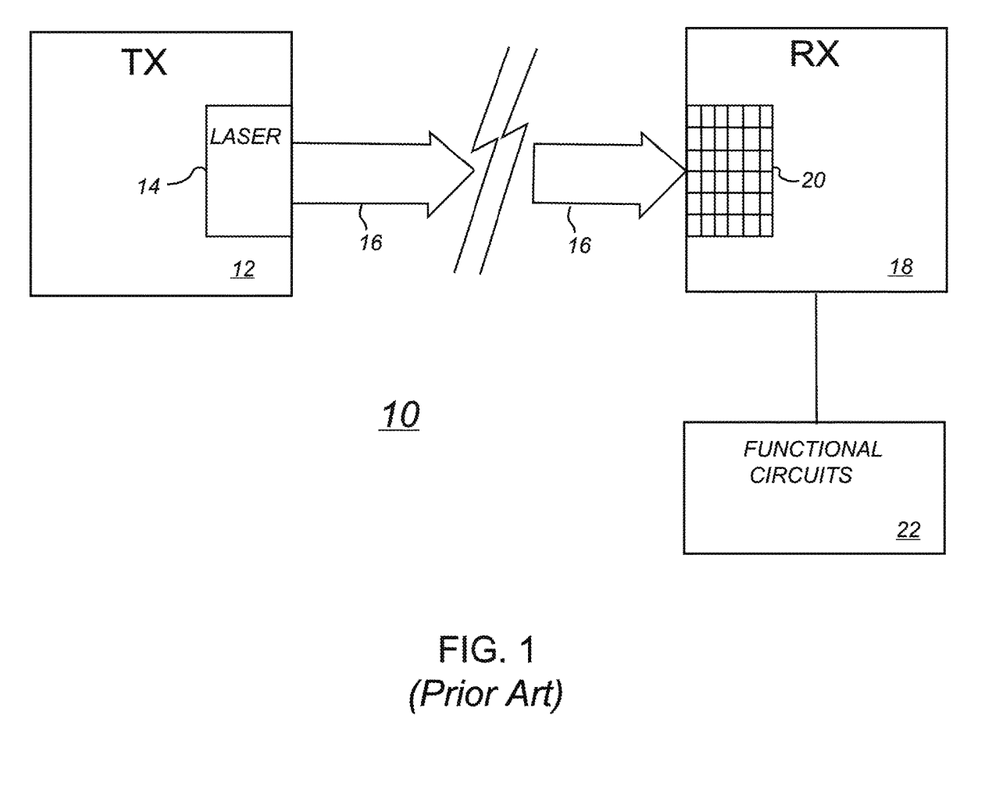
FIG. 1 is a conventional laser power beaming system having a transmitter and a receiver.

One form of remote power is a laser power beaming system. A laser power beaming system includes a transmitter (TX) and a receiver (RX). FIG. 1 illustrates a conventional laser power beaming system 10 having a transmitter 12 and a receiver 18. The transmitter 12 forms a high-flux beam of laser light 16, which is projected through the air over a distance toward the receiver 18. The receiver 18, which may be in a remote area having an absence of easily available power, includes a light reception module 20 (e.g., a photovoltaic array) to receive the high-flux beam of laser light 16. At the receiver 18, the laser light 16 is converted to usable electric power, which is transported to one or more functional circuits 22 where the power is consumed or stored for later consumption.

In FIG. 1, the transmitter 12 includes a laser assembly 14, which converts electric power into optical power (i.e., light), typically but not necessarily in the near-infrared (NIR) portion of the optical spectrum wavelength between 0.7 and 2.0 µm. The laser assembly 14 may comprise a single laser or multiple lasers, which may be mutually coherent or incoherent. In some cases, the one or more lasers may be replaced by one or more light emitting diodes (LEDs), superradiant diodes, or some other high-intensity light source. The high-flux output of the laser assembly 14 passes through various optical elements (e.g., optical fibers, lenses, mirrors, etc.) which convert the raw laser light to a beam of a desired size, shape (e.g., circular or rectangular), power distribution, and divergence. Various elements of the laser assembly 14 also aim the high-flux beam toward the receiver 18.

After leaving the transmitter 12, the high-flux light beam 16 travels through free space toward the receiver 18. At the receiver 18, the high-flux light beam 16 strikes the light reception module 20. Power from the high-flux light beam 16 is captured, either directly or via collecting optics such as lenses or mirrors, and wholly or partly converted back to another form of useful power. In some cases, the light reception module 20 includes an array of photovoltaic (PV) cells which convert light to direct current (DC) electricity. In other cases, the light reception module 20 converts light to electricity in other ways, for example by converting the optical power to heat, which drives a heat engine (e.g., Stirling engine, turbine), a thermoelectric device, or some other device.

All of the subject matter discussed in the Background section is not necessarily prior art and should not be assumed to be prior art merely as a result of its discussion in the Background section. Along these lines, any recognition of problems in the prior art discussed in the Background section or associated with such subject matter should not be treated as prior art unless expressly stated to be prior art. Instead, the discussion of any subject matter in the Background section should be treated as part of the inventor's approach to the particular problem, which in and of itself may also be inventive.

BRIEF SUMMARY

The present disclosure is directed toward high-flux power beam system technology. Prior to transmitting a high-flux power beam, a receiver is located. The problems of finding a receiver in a broad field and aiming toward a receiver with precision in a power beam system are solved by using the power beam transmitter in a low-flux mode over a wide angle, receiving return information, and aiming the transmitter based on the return information.

In a first case, a power beaming transmission unit includes power beam circuitry to wirelessly deliver electric power as a power beam from a first location to a second location, the first and second locations being remote from each other. The power beam circuitry is arranged to provide an output beam having at least two power intensity levels, a high-flux intensity level defining a hazardous illumination volume and a low-flux intensity level defining a safe illumination volume. The power beam transmission unit also includes control circuitry configured to direct a transmitter of the power beam circuitry to transmit a wide-angle output of a low-flux search beam during a first time window. The control circuitry is also configured to detect, via a detector of the power beam circuitry, at least one returned signal as a reflection of the low-flux search beam during the first time window, and based on the at least one returned signal, the control circuitry is configured to identify a location of a remote reception unit during the first time window. The control circuitry is configured further still to aim the transmitter of the power beam circuitry toward the identified location of the remote reception unit during the first time window, and direct the transmitter of the power beam circuitry to deliver a narrow-angle output of a high-flux power beam during a second time window.

In some embodiments of the first case, the directing, detecting, identifying, and aiming are performed a plurality of times during the first time window. In some embodiments, directing the transmitter of the power beam circuitry to transmit the wide-angle output of the low-flux search beam during the first time window includes transmitting a narrow-angle output of the low-flux search beam in a determined sweeping pattern during the first time window. In these or in other embodiments, the power beam circuitry includes at least one wide-angle lens positioned in an optical path of the low-flux search beam during the first time period, and in some embodiments, the detector includes at least one photodetector. In these photodetector cases, the at least one returned signal crosses an intensity threshold sufficient to determine that the at least one returned signal is caused by the reflection of the low-flux search beam from a reflector associated with the remote reception unit.

In some alternative or additional embodiments of the first case, the detector of the control circuitry includes at least one photodetector, wherein the transmitter of the power beam circuitry is directed to transmit the wide-angle output of the low-flux search beam during the first time window according to a selected time pattern, and wherein the at least one returned signal includes a plurality of light reflections corresponding to the selected time pattern. In yet other alternatives, the detector includes at least one image sensor, wherein the at least one returned signal includes at least one image captured by the image sensor of a volume illuminated by the wide-angle output of the low-flux search beam during the first time window, wherein the control circuitry is further configured to identify a determined pattern in the at least one image, the determined pattern corresponding to a reflector pattern associated with the remote reception unit.

In additional or yet other alternative embodiments of the first case, the detector includes at least one transceiver, the at least one transceiver arranged to receive directional information from the remote reception unit during the first time window, the directional information based on the reception unit receiving at least a portion of the transmitted wide-angle output of the low-flux search beam during the first time window. And in some embodiments, the detector includes at least one transceiver, wherein the transmitter of the power beam circuitry is directed to dynamically aim the transmitter of the power beam circuitry in response to feedback information received from the remote reception unit. In still other embodiments of the first case, before directing the transmitter of the power beam circuitry to transmit the wide-angle output of the low-flux search beam during the first time window, the control circuitry is further configured to aim the transmitter of the power beam circuitry based on stored location information associated with the reception unit.

In a second case, a power beaming method is executed by power beam circuitry. The power beam circuitry is arranged to wirelessly deliver electric power as a power beam from a first location to a second location, the first and second locations being remote from each other. In this second case, the power beam circuitry is arranged to provide an output beam having at least two power intensity levels, a high-flux intensity level defining a hazardous illumination volume and a low-flux intensity level defining a safe illumination volume. The method includes transmitting, with a power beam transmitter, a low-flux search beam over a wide-angle during a first time window, detecting at least one returned reflection of the low-flux search beam during the first time window, and identifying a location of a remote reception unit based on information contained in the at least one returned reflection. The method also includes aiming the power beam transmitter toward the identified location of the remote reception unit, and focusing a high-flux power beam toward the identified location of the remote reception unit during a second time window.

In some embodiments of the second case, the active transmitting of the low-flux search beam over the wide-angle during the first time window includes positioning a wide-angle lens in an optical beam path of the low-flux search beam. In these or in other embodiments, transmitting the low-flux search beam over the wide-angle during the first time window includes transmitting the low-flux search beam over a narrow-angle in a determined sweeping pattern during the first time window. Transmitting the low-flux search beam over the wide-angle during the first time window in some embodiments includes transmitting according to a selected time pattern, and wherein identifying the location of the remote reception unit based on information contained in the at least one returned reflection includes recognizing the selected time pattern in the at least one returned reflection. In still other embodiments, detecting at least one returned reflection of the low-flux search beam during the first time window includes capturing, with at least one image sensor at least one image of a volume illuminated by the wide-angle output of the low-flux search beam during the first time window.

In a third case, a power beaming system includes a power beam reception unit and a power beam transmission unit. The power beam reception unit includes a power conversion array arranged to capture at least a portion of a power beam and a power supply circuit, the power supply circuit arranged to convert flux from the captured portion of the power beam to electric power. The power beam transmission unit includes a power beam transmitter circuit arranged to transmit a low-flux search beam during a first time window, and further arranged to transmit a high-flux power beam during a second time window, and the power beam transmission unit also includes a location detection circuit arranged to identify a location of the reception unit in association with the power beam transmitter circuit transmitting the low-flux search beam during the first time window.

In some embodiments of the third case, the power beam reception unit includes a plurality of retro-reflectors arranged in a determined pattern, and in some embodiments, the power beam is a laser-based power beam. In some embodiments of the third case, the power conversion array of the power beam reception unit includes a photovoltaic array, the photovoltaic array arranged to determine a focusing-status value representing an intensity of the low-flux search beam captured by the photovoltaic array during the first time window, and wherein the power beam reception unit is arranged to communicate the focusing-status value to the power beam transmission unit during the first time window. In these or alternative embodiments of the third case, the power beam transmission unit includes at least one first configuration of optical elements positioned in an optical path of the low-flux search beam during the first time period, and at least one second configuration of optical elements positioned in an optical path of the high-flux power beam during the second time period, wherein the first configuration of optical elements produces a high-divergence beam active during the first time period, and wherein the second configuration of optical elements produces a low-divergence beam active during the second time period, wherein divergence of the high-divergence beam is higher than divergence of the low-divergence beam.

This Brief Summary has been provided to introduce certain concepts in a simplified form that are further described in detail below in the Detailed Description. Except where otherwise expressly stated, the summary is not intended to identify key or essential features of the claimed subject matter, nor is it intended to limit the scope of the claimed subject matter.

BRIEF DESCRIPTION OF THE SEVERAL VIEWS OF THE DRAWINGS

Non-limiting and non-exhaustive embodiments are described with reference to the following drawings, wherein like labels refer to like parts throughout the various views unless otherwise specified. The sizes and relative positions of elements in the drawings are not necessarily drawn to scale. For example, the shapes of various elements are selected, enlarged, and positioned to improve drawing legibility. The particular shapes of the elements as drawn have been selected for ease of recognition in the drawings. One or more embodiments are described hereinafter with reference to the accompanying drawings in which.

DETAILED DESCRIPTION

The present application is related to the following applications filed on the same day as the present application, naming the same inventors, and assigned to the same entity; each of said applications incorporated herein by reference to the fullest extent allowed by law: U.S. patent application Ser. No. 15/574,655, entitled MULTI-LAYERED SAFETY SYSTEM, filed Nov. 16, 2017; U.S. patent application Ser. No. 15/574,6571, entitled LIGHT CURTAIN SAFETY SYSTEM, filed Nov. 16, 2017; U.S. patent application Ser. No. 15/574,659, entitled DIFFUSION SAFETY SYSTEM, filed Nov. 16, 2017; U.S. patent application Ser. No. 15/574,663, entitled POWER BEAMING VCSEL ARRANGEMENT, filed Nov. 16, 2017; U.S. patent application Ser. No. 15/574,668, entitled WIRELESS POWER TRANSMITTER AND RECEIVER, filed Nov. 16, 2017.

In the following description, certain specific details are set forth in order to provide a thorough understanding of various disclosed embodiments. However, one skilled in the relevant art will recognize that embodiments may be practiced without one or more of these specific details, or with other methods, components, materials, etc. In other instances, well-known structures associated with computing systems including client and server computing systems, as well as networks have not been shown or described in detail to avoid unnecessarily obscuring descriptions of the embodiments.

Prior to setting forth the embodiments however, it may be helpful to an understanding thereof to first set forth definitions of certain terms that are used hereinafter.

The term power beam is used, in all its grammatical forms, throughout the present disclosure and claims to refer to a high-flux light transmission that may include a field of light, that may be generally directional, that may be arranged for steering/aiming to a suitable receiver. The power beams discussed in the present disclosure include beams formed by high-flux laser diodes or other like sources sufficient to deliver a desirable level of power to a remote receiver without passing the power over a conventional electrical conduit such as wire.

The term, "free space," as it is used in the present disclosure, means any reasonably transparent medium such as air or vacuum, water, gas, and the like. Free space is distinguished from a mechanical medium such as an optical fiber or conduit that confines or encloses a high-flux light beam or field. Within the present disclosure, a free space path may include one or more mirrors, lenses, prisms, or other discrete optical elements that redirect or alter particular characteristics of the high-flux light.

The present invention may be understood more readily by reference to the following detailed description of the preferred embodiments of the invention. It is to be understood that the terminology used herein is for the purpose of describing specific embodiments only and is not intended to be limiting. It is further to be understood that unless specifically defined herein, the terminology used herein is to be given its traditional meaning as known in the relevant art.

The dangers of high-flux laser light are addressed in various U.S. and international standards. For example, in ANSI Z136.1, a laser eye exposure hazard is defined as being a function of the laser wavelength, flux (in $W/cm^2$), pulse width, and the apparent angular size (AAS) of the source. In many cases, the flux ($W/m^2$) in an optical high-flux power beam is substantially above the safe limit for exposure to living tissue such as a human or animal eye. In some cases, the flux is high enough to cause eye damage and/or other non-eye damage such as burns or other changes to living tissue. In addition to eye or other tissue damage, the high-flux power beam may also cause burns or other damage to non-living objects. Accordingly, safety may be improved in a system arranged to detect when people, animals, or other objects are in or will imminently enter the high-flux beam path during the time the beam is activated. In these and other cases, it may also be important to deter and/or prevent people, animals, and objects from entering the beam path while the beam is activated or will soon be activated. In the alternative, or in addition, operating a search beam at or below the safe limit for exposure to living tissue at particular times, under particular conditions, or in other circumstances, will also improve safety.

Embodiments described in the present disclosure permit the safe use of potentially hazardous high-flux laser transmitters by employing certain portions of the system to provide one or more safety features. For example, in some embodiments, the laser transmitter itself is selectively operated at reduced power or otherwise in a safe mode (e.g., pulsing, diverging a beam into a wider angle, changing operating parameters, or taking other such actions). In these and in other embodiments, the laser transmitter is operated using a lower or otherwise safer power output, in conjunction with a suitable detector, to sense the presence of objects such as people in or near a region of potential hazard. In these safety embodiments, the system is operated in one or more lower power safety modes prior to operating the system at full power or intermittently during normal operation.

A wireless power beaming system, when operating to transmit a high-flux power beam, generally has a narrow field of view through the main power beaming optics of the transmission unit. For this reason, the transmission unit should be pointed in the approximate direction of a power receiver before power transfer begins. In some embodiments of the present disclosure, a wireless power beaming transmitter uses a wide-angle emitted signal to facilitate locating one or more power beam receivers. In addition, or in the alternative, some embodiments of the present disclosure also use a wide angle detector to help locate one or more power beam receivers within range of the power beaming transmitter.

In some embodiments, one or more retro-reflectors are located on a power beam receiver, in proximity to a power beam receiver, or in some other known reference location associated with at least one power beam receiver. A light source, which may be the power beaming transmitter or which may be another light source, is located with the transmission unit, in proximity to the transmission unit, or in some other known reference location associated with the transmission unit. In addition, at least one detector is arranged in a known location (e.g., with the transmission unit, in proximity to the transmission unit, or in some other known reference location associated with the transmission unit). The detector is arranged to detect some or all of a reflected portion of a signal transmitted in cooperation with a power beam receiver locating procedure. For example, the detector is arranged to detect the signal, determine the signal intensity, and in some cases, determine the signal direction. A camera, for example, with a wide-angle lens may be arranged as such a detector in some embodiments.

In some cases, wide-angle lenses as used in the present disclosure are a single optical structure, such as a fish-eye lens. In other cases, a wide-angle lens is a composite optical structure, such as a zoom lens structure, which includes one or more lenses and a mechanism whereby at least one optical structure can move. In such a composite optical structure, at least one lens may be arranged to reciprocate or otherwise move relative to at least one other structure. As described herein, a wide-angle lens may in some cases be positioned in front of an out-going, transmitted search beam. In these cases, the out-going search beam is widely spread over a large illumination volume. Alternatively, or in addition, the wide-angle lens may be positioned in front of a detection device such as a photo detector or an imaging device. When the wide-angle lens is so positioned in front of a detection device, the detection device receives light input from over a large illumination volume. In any of these cases, when the information is received at an appropriate detection device based on a transmitted beam (e.g., a low-flux search beam), the wide-angle lens will have been positioned in the optical path of the low-flux search beam.

In the power beam receiver locating procedure, a signal pulse (e.g., a flash of visible or invisible light) is emitted from a transmission unit source across a wide angle, for example up to a half sphere (pi steradians), a full sphere (2 pi steradians), or some other size. Because the signal reflection returned from a retro-reflector will generally be brighter or otherwise have a higher intensity than other reflections or light from other sources, a determination can be made that a particular detected reflection serves to identify a location of a power beam receiver.

In at least one embodiment, the retro-reflectors or another type of useful reflector associated with a power beam receiver can be arranged in a particular pattern. In these cases, and in some other cases, signals detected by the detector are processed to determine if the detected signal represents an expected or otherwise known pattern.

Figure 2A:
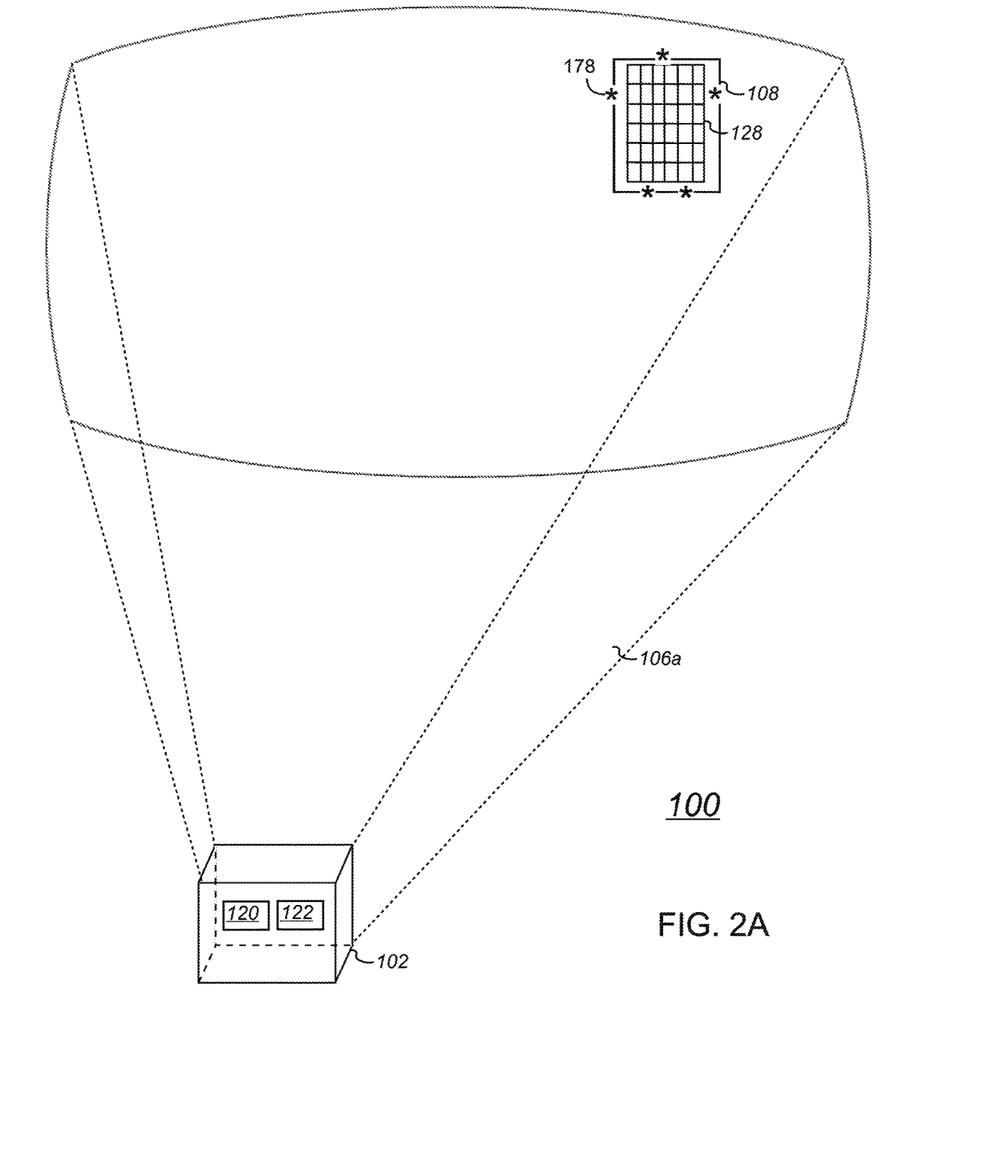
FIGS. 2A-2C are a power beaming system embodiment locating a receiver.
Figure 2B:
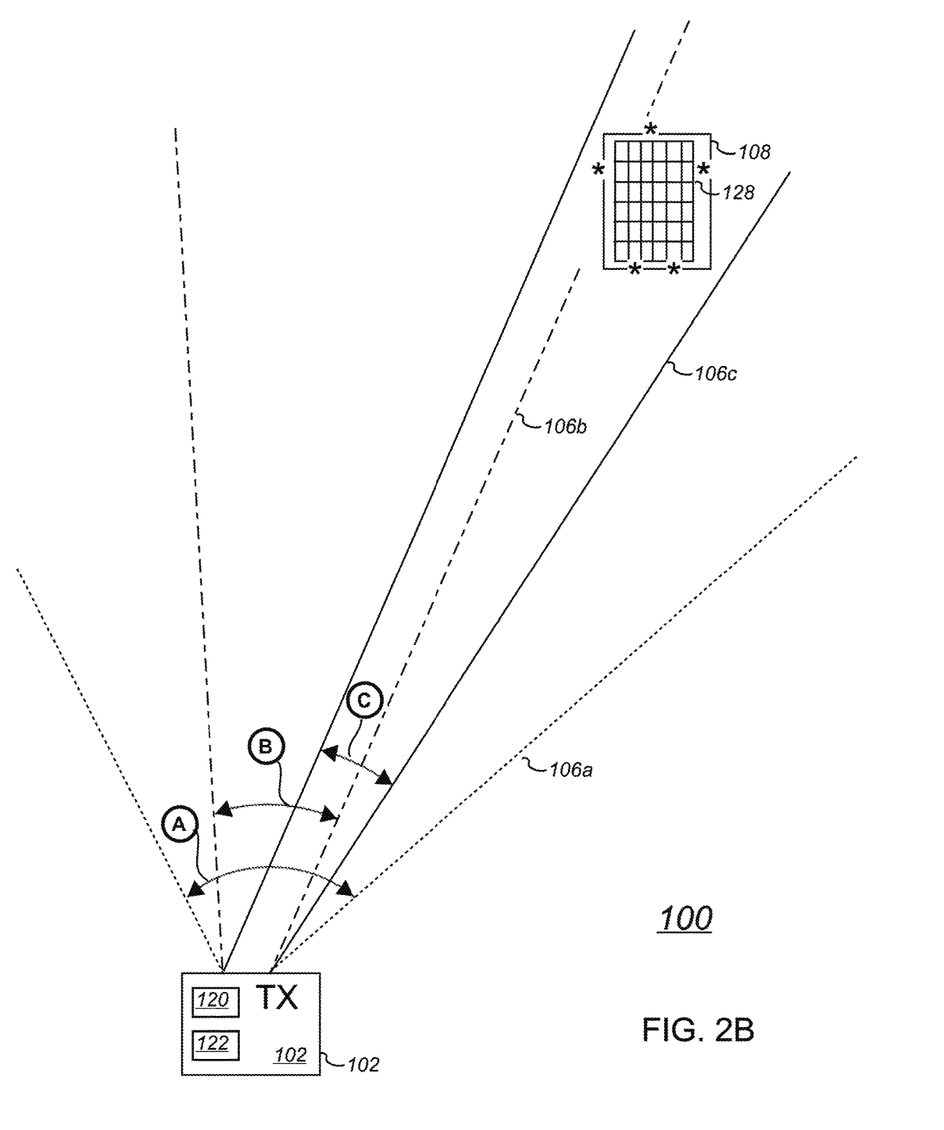
Figure 2C:
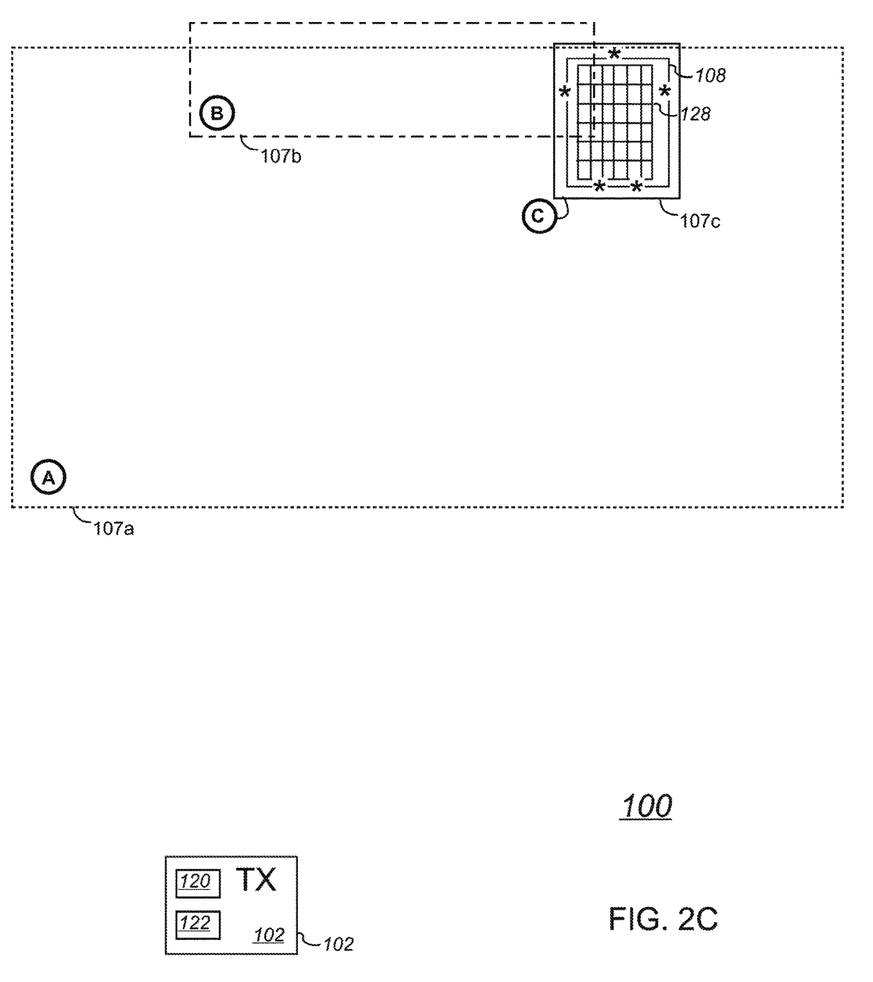

FIGS. 2A-2C are a power beaming system embodiment 100 locating a receiver. In the figures, a power beam transmission unit 102 includes power beam circuitry 120 and control circuitry 122. A power beam reception unit 108 includes a power conversion array 128, which may be a photovoltaic array or some other type of power conversion system arranged to capture at least a portion of a power beam. Here, the power beam transmission unit 102 is arranged to wirelessly deliver electric power as a power beam from a first location to a second location. In FIG. 2A, for example, the transmission unit 102 is in a first location, and a receiving unit 108 is in a second location, which is remote from the first location.

The transmission unit 102, via the power beam circuitry 120, under direction of the control circuitry 122, is arranged to transmit an output beam having at least two power intensity levels, a high-flux intensity level and a low-flux intensity level. The output beam having the high-flux intensity level is formed as a high-flux power beam generally delivered over a narrow angle toward a power beam receiver 108, and during this time, the transmission path of the high-flux power beam defines a hazardous illumination volume. Conversely, the output beam having the low-flux intensity level is formed as a low-flux search beam, which may be delivered over a wide angle, a narrow angle, or some other angle because, under known and controlled conditions. A search beam operating at or below the low-flux level, will define an illumination volume that is deemed safe for humans, animals, and objects.

In some cases, the low-flux beam may be modulated to enhance its detectability or to enhance the detectability of reflections. Modulation may include pulse modulation (e.g., low-duty-cycle pulses), amplitude modulation (e.g., including sine or square-wave modulation), frequency or phase modulation, polarization modulation, or some other modulation scheme.

In addition to circuitry that is capable of forming an output beam having at least two power intensity levels, the power beam circuitry 120 may also include another low-flux light source and cooperative low-flux search beam generation circuitry that is also arranged to form and transmit a low-flux search beam. This secondary circuitry of the power beam circuitry 120 (i.e., the low-flux light source and cooperative low-flux search beam generation circuitry), may include an LED light source or some other low-flux light source. In this way, the transmission unit 102 may operate a high-flux light source to generate a high-flux power beam and a separate and distinct low-flux light source to generation a low-flux search beam. Alternatively, the transmission unit 102 may operate a high-flux light source to generate a high-flux power beam, and the transmission unit 102 may also operate the high-flux light source in a low-flux mode, via the power beam circuitry 120, to generate the low-flux search beam.

In FIG. 2A, the control circuitry 122 of the transmission unit 102 is arranged to direct a transmitter of the power beam circuitry 122 to transmit a wide-angle output of a low-flux search beam 106a during a first time window. The first time window may be, for example, less than 100 microseconds ($\mu s$), 5 to 50 milliseconds (ms), several seconds, or some other duration. For the sake of simplicity in the illustration of FIG. 2A, the wide-angle low-flux search beam 106a is illustrated as having a range that encompasses a large volume, which is substantially large relative to the location occupied by the power beam reception unit 108. In some cases, for example, the wide angle covers a volume up to a half sphere (pi steradians), a full sphere (2 pi steradians), or some other size. The wide angle may be facilitated by placing at least one strongly diverging lens (e.g., a lens having a field of view greater than 90 degrees, a fish-eye lens, or another like structure) in the optical path of the low-flux search beam during the first time period. In addition, or in the alternative, the wide angle may be facilitated by transmitting a narrow-angle output of the low-flux search beam in a determined sweeping pattern during the first time window, wherein the sweeping pattern is arranged to transmit the low-flux search beam 106a in a way that covers a larger volume over time than the cross-section of the low-flux search beam covers in any given instant.

In some cases, such with respect to a sweeping pattern, but not limited to a sweeping pattern, the low-flux search beam 106a may be arranged in a suitable shape, intensity level, or other such characteristic. For example, in some cases, increased safety is desired, and in other cases, safety concerns are reduced. For example, in a case of a land-based transmission unit 102 and a sea-based reception unit 108, safety concerns may be reduced. In this type of circumstance, the low-flux search beam 106a may have a second, higher intensity mode. Conversely, in an urban setting, the low-flux search beam 106a may have a second, lower intensity. In still other cases, such as a neighborhood, rural, or other setting, the low-flux search beam 106a may have two or more intensity levels, such as a higher intensity level when beamed in directions above a particular threshold angle, and a lower intensity level when beamed in a downward particular threshold angle such as 30 degrees below horizon. Lower intensity levels may be used when the low-flux search beam 106a is directed over houses or other populated areas to avoid illuminating people or objects on the ground, and higher intensity levels may be used when the low-flux search beam 106a is directed over empty land or other unpopulated areas. In some cases, two or more intensity levels may be used during a single "sweep."

Before, after, or concurrent with transmission of the low-flux search beam 106a during the first time window, the control-circuitry 122 cooperates with at least one detector associated with the power beam circuitry 120 to detect at least one returned signal as a reflection of the low-flux search beam 106a during the first time window.

For example, in some cases, one or more detectors associated with the power beam circuitry 120 include a photodetector. In cases where the control circuitry 122 directs the transmitter to transmit the wide-angle output of the low-flux search beam 106a according to a selected time pattern (e.g., time varying pulses), a particular photodetector detects reflections of the low-flux search beam and provides one or more return signals that represent the plurality of low-flux search beam (e.g., light) reflections corresponding to the selected time pattern. In some of these cases, a photodetector may return raw data that represents an intensity of light captured by the photodetector. In other cases, the photodetector includes additional processing circuitry such that the photodetector only provides data under selected circumstances. In this way, the presence, location, and other information associated with a particular power beam reception unit 128 can be determined with an acceptably sufficient accuracy. For example, the photodetector or control circuitry 122 as the case may be may determine that at least one returned signal has crossed an intensity threshold sufficient to determine that the returned signal is caused by the reflection of the low-flux search beam 106a from the remote power beam reception unit 128 or some structure associated therewith (e.g., one or more reflectors, such as retro-reflectors, arranged singularly, or arranged in one or more patterns on or otherwise in association with the reception unit).

As another example, in some cases, one or more detectors associated with the power beam circuitry 120 include a camera or some other type of image sensor. In these cases, the detector (i.e., the camera, image sensor, etc.) will capture one or more images of the volume illuminated by the wide-angle output of the low-flux search beam 106a during the first time window. In these cases, for example, the power beam reception unit 108 may be arranged with one or more fiducial elements 178 arranged about the reception unit 108 in a particular location, pattern, or other circumstance. In FIG. 2A, a single fiducial element 178 is called out for simplicity in the drawing, however, five fiducial elements are illustrated in a "star" pattern. Any other number of fiducial elements, patterns, or arrangements could of course be used. In these cases, the control circuitry 122 is further configured to identify a determined pattern in one or more of the images captured by the particular detector. In cases where the identified determined pattern corresponds to a reflector pattern associated with a power beam reception unit 108, the control circuitry 122 will determine that the power beam reception unit 108 has been identified with an acceptable accuracy.

In these cases, and in other cases, based on one or more return signals that are detected, captured, or otherwise perceived, the control circuitry 108 will determine that a power beam reception unit 108 is found within the volume covered by the wide-angle output of the low-flux search beam 106a. In addition, based on the one or more return signals, the control circuitry will identify a location of the remote power beam reception unit 108. In some cases, the control circuitry 122 will determine that the identified location represents a volume smaller than the volume covered by the wide-angle output of the low-flux search beam 106a, but insufficiently precise as to transmit a high-flux search beam 106. In these cases, further processing is performed to identify the location of the remote power beam reception unit 108 with greater precision. On the other hand, in cases where the control circuitry 122 determines that the identified location of the remote power beam reception unit 108 is determined with sufficient accuracy, the control circuitry 122 will direct aiming the transmitter of the power beam circuitry toward the identified location. Once aimed, the power beam transmission unit 102 will end its first time window, in which a remote power beam reception unit 108 is located, and the power beam transmission unit 102 will enter a second time window. In the second time window, the control circuitry 122 will direct the transmitter of the power beam circuitry 122 deliver a narrow-angle output of a high-flux power beam toward the identified location of the remote reception unit.

In the present disclosure, it is understood that "aiming" a transmission unit or portions thereof may include physical motion of an entire transmission system and may alternatively or in additional also include physical motion of a portion of the transmission unit. In addition, aiming a transmission unit may also include no physical motion of any physical structure. Accordingly, aiming a transmission unit, one or more portions of a transmission unit, a high-flux power beam, a low-flux search beam, or any other output beam may include physical motion or electrically induced non-physical motion to adjust the structure or beam such that the transmitted beam axis is aligned with the desired location, such as a remote reception unit. For example, aiming may include adjusting the orientation of an output mirror, adjusting the orientation of the transmitter beam director, physically rotating a transmitter assembly, applying a control signal to shape or otherwise direct a beam, and any other like actions.

In some cases, such as when the control circuitry 122 performs an initial location detection procedure to identify a location of a remote power beam reception unit 108, and one such initial location detection procedure is successful, the control circuitry 122 performs additional operations to identify the location of the power beam reception unit 108 with greater precision. In these cases, the directing, detecting, identifying, and aiming carried out by the control circuitry 122 may be performed a second time, a third time, or any plurality of times during the first time window.

When the control circuitry performs an initial location detection procedure, one or more parameters may be retrieved, loaded, or otherwise implemented to guide operations of the initial search procedure. For example, certain information such as a rough position of an expected remote power beam reception unit 108 may be used to guide the search procedure. The rough position information may come from a global positioning system (GPS) for example, a map coordinate, or some other source. A center of search area may be used as an initial parameter, and a particular angle from any desirable reference point may also be used as initial parameter information. In cases where two or more iterations of the search procedure are found, the parameters from any earlier search procedure iteration may be used to update parameters for a subsequent search procedure iteration. In this way, the search procedure may be made more efficient. The first iteration of a search procedure may begin with initial known, suspected, or default location data and other parameters, and each subsequent iteration of the search procedure may include progressively more accurate or otherwise useful data and parameters.

FIGS. 2B and 2C show additional aspects of the power beaming system embodiment 100. In FIGS. 2B and 2C, the control circuitry of the power beam transmission unit 102 performs an iterative procedure to direct operations of a transmitter and at least one detector of the power beam circuitry 120. In FIGS. 2B-2C, a first iteration is identified as having a wide-angle subtended by the arc labeled with an encircled "A". Correspondingly, the second and third iterations are identified as having wide-angles subtended by the arcs labeled by the encircled "B" and the encircled "C", respectively. Accordingly, FIG. 2B illustrates three iterations of a procedure to locate a power beam reception unit 128. In the first iteration, a low-flux search beam 106a is transmitted having a very large wide-angle output, "A". In the second iteration, the low-flux search beam 106b is transmitted having a smaller wide-angle output, "B", and in the third iteration, the low-flux search beam 106c is transmitted having a still smaller wide-angle output, "C."

Summarizing the iterative procedure, it is shown in FIG. 2B that during a first time window to locate a power beam reception unit 108, a transmission unit 102 first transmits a very wide low-flux search beam 106a. As a result of transmitting the very wide signal in the first iteration, return signals are detected and used to identify a general location of the power beam reception unit 108. The transmitter of the transmission unit 102 is aimed toward the general location, and the transmission unit 102 next transmits a wide-angle low-flux search beam 106b having a moderate arc "B". Based on detected return signals in the second iteration, a location of the power beam reception unit 108 is identified with greater precision, but still insufficient precision. Remaining still in the first time window, the transmission unit 102 is re-aimed with the updated signal detection information, and the transmission unit 102 transmits a wide-angle low-flux search beam 106c having an even smaller arc "C". Based on detected reflections of the low-flux search beam 106c, a location of the remote power beam reception unit 108 is identified with sufficient precision.

As illustrated in FIG. 2B, three iterations are shown, (i.e., A, B, C). It is recognized, however, that the procedure to identify the location of a remote power beam receiver 108 may follow any number of iterations, which collect return signal data, adjust the wide-angle output of the transmission unit 102, and retransmit the low-flux search beam in order to identify the location of the power beam reception unit 108.

In FIG. 2C, representative detection windows are illustrated, which correspond to the three iterations illustrated in FIG. 2B. A first window 107a corresponds to a general detection volume searched when the wide-angle low-flux search beam 106a is output by the transmission unit 102. A second window 107b corresponds to a smaller general detection volume searched when the wide-angle low-flux search beam 106b is output by the transmission unit 102, and a third window 107c corresponds to a smaller-still general detection volume searched when the wide-angle low-flux search beam 106c is output by the transmission unit 102. For the purposes of simplifying the illustration and the understanding of the concepts described in the present disclosure, the general detection volumes 107a, 107b, 107c are shown as rectangles having particularly defined boundaries. It is understood, however, that the wide-angle output of the particular low-flux search beam will have indefinite boundaries, edges, shapes, and ranges from which useful return signal reflections will be captured.

Also in FIG. 2C, it is shown that the general detection volume 107a represents a very large volume in which a power beam reception unit 108 is suspected of being located. When the low-flux search beam 106a is transmitted, signal returns represent a detection of some if not all of the fiducial elements arranged in a particular reflective pattern 178 in an upper right corner of the general detection volume 107a. As a result of such information, the transmission unit 102 is re-aimed to cover a smaller detection volume 107b. As a result of transmitting the low-flux search beam 106b, signal returns representing reflections of the low-flux search beam detect fewer than all of the fiducial elements in the particular reflective pattern 178. Accordingly based on this updated information, the transmission unit 102 is re-aimed in a third iteration, and the transmission unit 102 transmits the third low-flux search beam 106c. Based on detected reflections of the low-flux search beam 106c, the control circuitry 122 determines that the location of the power beam reception unit 102 has been identified with sufficient accuracy. In this case, the transmission unit 102 is re-aimed toward the determined location of the remote power beam reception unit 108, and a high-flux power beam is transmitted.

Figure 3:
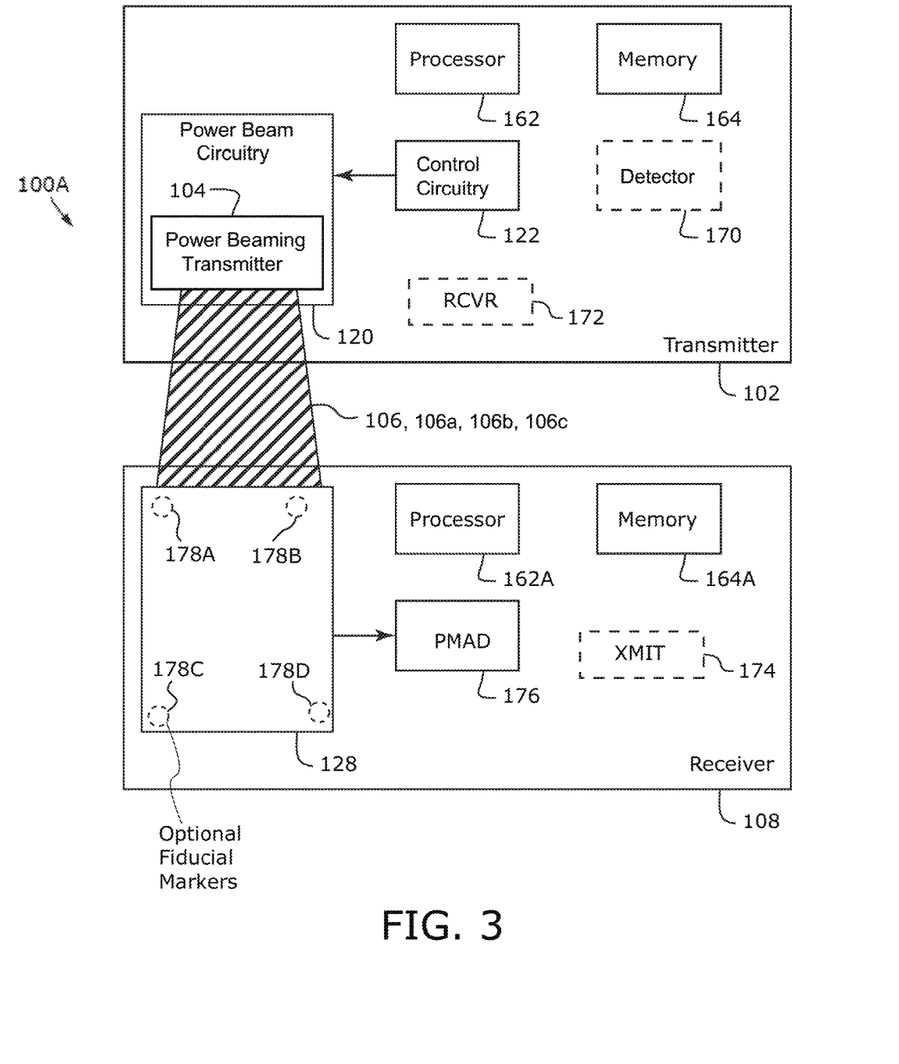
FIG. 3 is another power beaming system embodiment arranged to shape, aim, focus, and direct other aspects of a transmitted high-flux power beam and a low flux search beam.

FIG. 3 is another power beaming system embodiment 100A arranged to shape, aim, focus, and direct particular aspects of a transmitted high-flux power beam 106 and a low flux search beam 106a, 106b, 106c. The system embodiment of FIG. 3 includes a transmission unit 102 and a reception unit 108. The transmission unit 102 and reception unit 108 of FIG. 3 include particular structural elements described herein, and in addition, several optional elements that are present in some embodiments.

The transmission unit 102 of FIG. 3 includes a power beaming transmitter 104, which may be directed to generate and transmit an output beam having at least two power intensity levels: a high-flux intensity level defining a hazardous illumination volume, and a low-flux intensity level defining a safe illumination volume. The power beaming transmitter 104 may also be arranged to generate power beams having more or fewer power intensity levels. In cases where the power beaming transmitter 104 generates an output beam having a high-intensity, the output beam is a high-flux power beam 106. In cases where the power beaming transmitter 104 generate an output beam having low-intensity (e.g., using a high-flux light source in a low intensity mode or using a separate low-flux light source), the output beam is a low-flux search beam 106a, 106b, 106c (FIGS. 2A-2C).

The transmission unit 102 of FIG. 3 also includes a processor 162 and cooperative memory 164, at least one detector device 170, which may be a photodetector, a camera or other image sensor device, or some other type of detection sensor. The transmission unit 102 may also have an optional data receiver 172, which may be a wired or wireless transceiver.

The reception unit 108 of FIG. 3 includes a power conversion array 128, which may be a photovoltaic array, a heat engine (e.g., Stirling engine, turbine), a thermoelectric device, or some other device. Cooperative with the power conversion array 128, the reception unit 108 of FIG. 3 includes a power management and distribution (PMAD) device 176, which is arranged to collect, store, distribute, or otherwise manage electrical power converted from the power conversion array 128. In some embodiments, one or more fiducial elements 178A-178D are arranged in a particular reflector pattern 178 about the power beam reception unit 108. The fiducial elements may be formed as retroreflectors, mirrors, reflective tape, light sources (e.g., LEDs, transducers, beacons, and the like) or some other active or passive material structure. In some cases, the fiducial elements 178A-178D, which may be arranged in a particular reflector pattern 178, are integrated in the structure of the power beam reception unit 108, located in proximity to the power beam reception unit 108, or located in association with a known reference point in some other way.

The power beam reception unit 108 includes a processor 162A and cooperative memory 164A. Optionally, in some embodiments, the power beam reception unit 108 also includes a data transmitter 174. In some cases, the data transmitter 174 of the power beam reception unit 108 may be embodied as a transceiver. The data transmitter 174 (e.g., a transceiver) may be particularly arranged to communicate with the data receiver 172 (e.g., a transceiver) of the power beam transmission unit 102.

Using the processor 162 and cooperative memory 164, or using discrete circuits to implement a finite state machine or other control logic, the transmission unit 102 may be arranged to control particular adjustable parameters such as a lens zoom, a lens selection, positioning of symmetrical or asymmetric optical elements, adjusting power output, performing one or more iterative power beam locating procedures, or take other actions. Correspondingly, the processor 162A and cooperative memory 164A, or discrete circuits to implement a finite state machine or other control logic, may be used by the reception unit 108 to direct processing of the power beam reception unit 108. In some cases, the power beam reception unit 108 performs particular acts that support one or more power beam reception unit locating procedures.

Using one or more optional detectors (e.g., a detector device 170), the transmission unit 102 may be arranged to identify or otherwise determine the direction, distance, location, range, volume, area, and other parameters associated with the power beam reception unit 108. For example, in some cases, the detector device 170 is embodied as a camera or some other such imaging device, which is arranged to capture image data associated with the reception unit 102 during a particular power beam receiver locating procedure. In this case, particular image processing carried out by the processor 162 and cooperative memory 164 produces data during a first time window in association with a wide-angle output of a low-flux search beam. Based on such processing, the transmission unit 102 may be aimed with increased confidence that a transmitted high-flux power beam 106 is effectively formed, aimed, and delivered.

Alternatively, or in addition, the transmission unit 102 may embody a detector device 170 as a camera or another imaging device that images one or more fiducial elements 178A-178D physically positioned in association with the reception unit 108. The imaging device or the processor 162 and memory 164 may determine the orientation, location, distance, or other information about the reception unit 102, and alternatively or in addition, the power conversion 128. As yet another alternative, the reception unit 108 may include means of sensing or otherwise determining its own location information, or the reception unit 108 may be arranged to determine its own orientation, relative to the environment for example via use of a tilt sensor or some other sensor, relative to the transmission unit 102, relative to the high-flux power beam 106, or relative to some other reference point. The reception unity may then send this information to the transmission unit 102 via optional radios (e.g., data transmitter 174 and data receiver 172). In other cases, the reception unit 108 may also sense information about the high-flux power beam 106, and inform the transmission unit 102 as to whether or not the transmitted high-flux power beam 106 is too large, too small, or otherwise mis-matched to the defined perimeter shape of the power conversion array 128.

In some cases of the power beam system embodiment 100A of FIG. 3, the transmission unit 102 communicates information directly to the reception unit 108. Such communication may be during an initialization procedure, during a procedure to locate a power beam receiver, on an ongoing basis, or at some other time. For example, the data receiver 172 of the transmission unit 102 may be configured as a transceiver that includes the ability to transmit data. Correspondingly the data transmitter 174 of the reception unit 108 may be configured as a transceiver that includes the ability to receive data. The communicated data may include timing information, efficiency information, scheduling information, information about the high-flux power beam 106, or any other type of information. In some cases, the data communication features are performed using the high-flux power beam 106 and the power conversion 128 in cooperation with the processors and memory associated with each respective unit. The transmission unit 102, for example, may modulate the high-flux power beam 106 in time, amplitude, frequency, or in some other way to communicate data. Correspondingly, the reception unit 128 may analyze information perceived at the photovoltaic array 128, such as changes in intensity of the high-flux power beam 106 or other modulation information, and from this, the reception unit 108 may capture useful information in the high-flux power beam 106 itself.

In other embodiments, the data receiver 172 of the transmission unit 102 and the data transmitter 174 of the reception unit 108 may be configured to cooperate during a power beam receiver locating procedure, or some other procedure. In some cases the cooperation is ongoing, such as in a feedback loop. In one embodiment, for example, the data receiver 172 of the transmission unit 102 is arranged to receive directional information from the remote reception unit 108 during the first time window. The directional information may be based on the power beam reception unit 108 receiving at least a portion of the transmitted wide-angle output of the low-flux search beam during the first time window. In some cases, power beaming transmitter 104 is directed to dynamically aim the power beam transmission unit 102 in response to feedback information received from the remote reception unit 108; for example via the data transmitter 174. In still other cases, before directing the power beaming transmitter 104 of the power beam circuitry 120 to transmit the wide-angle output of the low-flux search beam during the first time window, the control circuitry 122 is further configured to aim the power beaming transmitter 104 of the power beam circuitry 120 based on stored location information associated with the power beam reception unit 108.

Figure 4:
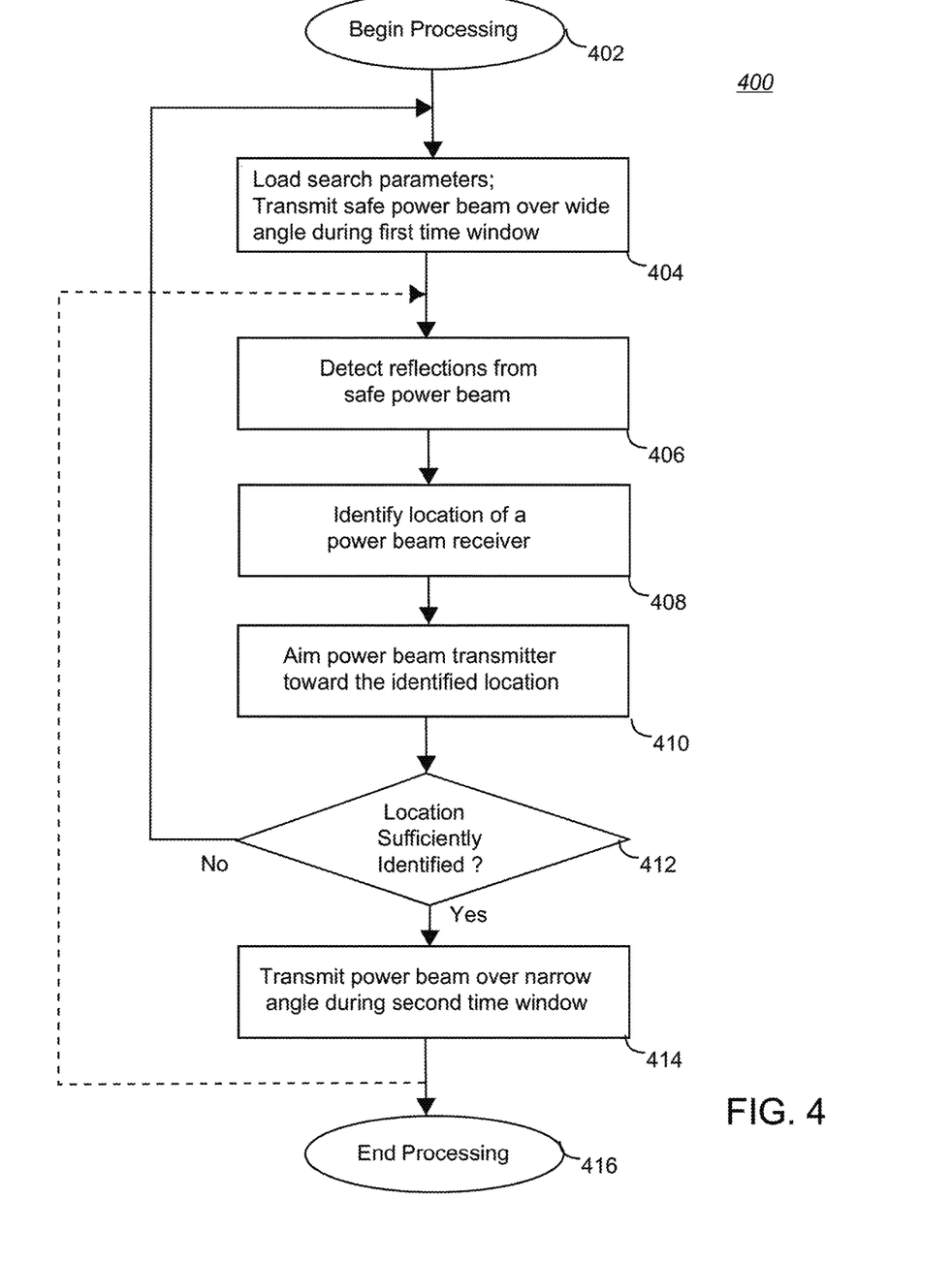
FIG. 4 is a logical flow diagram generally showing one embodiment of a power beam receiving unit locating procedure.

FIG. 4 is a logical flow diagram generally showing one embodiment of a power beam receiving unit locating procedure 400.

Process 400 begins at a start block 402. In the process, a power beaming method is executed by power beam circuitry.

The power beam circuitry is arranged to wirelessly deliver electric power as a power beam from a first location to a second location, the first and second locations being remote from each other. In the method, the power beam circuitry is arranged to generate an output beam having at least two power intensity levels: a high-flux intensity level defining a hazardous illumination volume, and a low-flux intensity level defining a safe illumination volume.

The power beaming method is executed in a power beaming system. The power beaming system includes a power beam reception unit and a power beam transmission unit. The power beam reception unit includes a power conversion array arranged to capture at least a portion of a power beam, and a power supply circuit. The power supply circuit is arranged to convert flux from the captured portion of the power beam to electric power. In some embodiments, the power beam is a laser-based power beam. In these embodiments, and in other embodiments, the power conversion array includes at least one photovoltaic array.

In some cases, the power conversion array is configured to convert power from the low-flux search beam 106a, when it strikes the power conversion array, into a small amount of electrical power. This electricity may be used by the reception unit 108 to power control circuits, communications circuits (e.g., to send information to the transmission unit 102 regarding reception of the low-flux search beam 106a), or other circuits (e.g., a motor to rotate the reception unit 108 to face toward the transmission unit 102). In addition, or in the alternative, the power may be used to trickle-charge a battery or other storage device, which can provide higher levels of power at a later time. For example, the wide, low-flux search beam 106a may point at the reception unit 108 for many seconds, thereby charging a capacitor, which then powers circuitry for a few milliseconds or longer.

Processing advances to block 404. At 404, initial search parameters are loaded. The initial search parameters may include an unverified location data associated with a suspected reception unit, angle of power beam transmission, power level data, and any other such parameters. After the initial parameter data is loaded, the power beam transmitter transmits a low-flux search beam over a wide-angle during a first time window. To this end, the power beam transmission unit may be arranged with at least one strongly diverging lens (e.g., a lens having a field of view greater than 90 degrees, a fish-eye lens, and the like) or some other optical beam broadening structure that is positioned in an optical path of the low-flux search beam during the first time period.

At block 406, one or more detection devices associated with the transmission unit are arranged to detect at least one returned reflection of the low-flux search beam during the first time window. The one or more detection devices may include a photo detector, a camera or another image sensor, or a particular location detection circuit arranged to identify a location of the reception unit in association with the power beam transmitter circuit transmitting the low-flux search beam during the first time window. In some cases, a power beam reception unit includes a plurality of retro-reflectors arranged in a determined pattern. The retro-reflectors, or other particularly positioned reflecting material, will return to the detection device a discernible, higher intensity detection signal than might otherwise be produced by different structures.

In some embodiments, the power beam reception unit actively participates in the power beam receiver locating procedure. For example, in some cases, a photovoltaic array is arranged in the receiving unit to determine a focusing-status value that represents an intensity of the low-flux search beam captured by the photovoltaic array during the first time window. In these cases, the power beam reception unit may be arranged to communicate the focusing-status value to the power beam transmission unit during the first time window. The focusing-status value, which represents a particular intensity, may be used iteratively to more accurately aim the power beam transmitter.

From block 406, processing advances to block 408.

At block 408, a location of a remote reception unit is identified based on information contained in the at least one returned reflection, and at block 410, the power beam transmitter is aimed toward the identified location of the remote reception unit. Processing advances to the decision block at 412 where the transmission unit determines whether or not the location of the reception unit has been sufficiently identified. In some cases, the location of the reception unit is sufficiently identified based on a number of returned reflection signals that identify a particular pattern (e.g., a pattern of retro-reflectors, a time pattern of pulses, or some other pattern). In some cases, the location of the reception unit is sufficiently identified based on communication from the reception unit (e.g., wireless data communications based on an intensity of a power beam received at the reception unit). In still other cases the location of the reception unit is sufficiently identified based on directional information of the detection devices, a time of flight of the low-flux search beam from transmission to reflection, from some outside reference such as a GPS device, or based on some other parameters.

If the location of the reception unit has not been sufficiently identified, processing returns back to 404. Returning to block 404, search parameters are updated and re-loaded. The search parameters may include any data or information learned in the previous search. For example, updated location data associated with a suspected reception unit, updated and possibly narrower angle of search beam transmission, an updated "center" of a search region, updated power level data, and any other such parameters. After reloading the updated search parameters at 404, the safe search beam is again transmitted, and processing continues through 406, 408, 412, and beyond.

In process 400, reflection data is detected, or otherwise captured, and analyzed at 406, a power beam receiver location is identified at 408, and the power beam transmitter is aimed, or re-aimed, toward the identified location. If the location is not sufficiently identified on a previous iteration, the process flow through process 400 inherently requires confirmation that the location of the power beam receiver has been sufficiently identified.

If the location of the power beam reception unit has been sufficiently identified at 412, processing advances to block 414. At 414, a high-flux power beam is focused toward the identified location of the remote reception unit during a second time window. In some cases, for example when an active feedback loop is employed to maintain accuracy of the high-flux power beam toward the power beam reception unit, processing returns and continues through blocks 406, 408, 410. As long as the location of the reception unit remains sufficiently identified, processing continues through 414 to transmit the high-flux power beam. Conversely, whenever the location of the reception unit is not sufficiently identified, processing returns to block 404, and the procedure to locate a reception unit, including transmission of a low-flux search beam over a wide-angle is performed again.

In some cases, when process 400 is not ongoing, process 400 ends at 416.

Certain words and phrases used in the present disclosure are set forth as follows. The terms "include" and "comprise," as well as derivatives thereof, mean inclusion without limitation. The term "or," is inclusive, meaning and/or. The phrases "associated with" and "associated therewith," as well as derivatives thereof in all grammatical forms, may mean to include, be included within, interconnect with, contain, be contained within, connect to or with, couple to or with, be communicable with, cooperate with, interleave, juxtapose, be proximate to, be bound to or with, have, have a property of, or the like. The term "controller" means any device, system, or part thereof that controls at least one operation, such a device may be implemented in hardware, firmware, or software, or some combination of at least two of the same. The functionality associated with any particular controller may be centralized or distributed, whether locally or remotely. Other definitions of certain words and phrases may be provided within this patent document. Those of ordinary skill in the art will understand that in many, if not most instances, such definitions apply to prior as well as future uses of such defined words and phrases.

Where one or more figures included in the present disclosure illustrates a data flow diagram, the illustrated process is a non-limiting process that may be used by embodiments of high-flux power beam or field systems. In this regard, each described process may represent a module, segment, or portion of software code, which comprises one or more executable instructions for implementing the specified logical function(s). It should also be noted that in some implementations, the functions noted in the process may occur in a different order, may include additional functions, may occur concurrently, and/or may be omitted.

The figures in the present disclosure illustrate portions of one or more non-limiting computing device embodiments such as power beaming system embodiment 100. The computing devices may include operative hardware found in conventional computing device apparatuses such as one or more processors, volatile and non-volatile memory, serial and parallel input/output (I/O) circuitry compliant with various standards and protocols, wired and/or wireless networking circuitry (e.g., a communications transceiver), one or more user interface (UI) modules, logic, and other electronic circuitry.

Processors, such as processors 162, 162A described herein, include central processing units (CPU's), microcontrollers (MCU), digital signal processors (DSP), application specific integrated circuits (ASIC), and the like. The processors interchangeably refer to any type of electronic control circuitry configured to execute programmed software instructions. The programmed instructions may be high-level software instructions, compiled software instructions, assembly-language software instructions, object code, binary code, micro-code, or the like. The programmed instructions may reside in internal or external memory or may be hard-coded as a state machine or set of control signals. According to methods and devices referenced herein, embodiments describe software executable by the processor and operable to execute certain ones of the method acts.

As known by one skilled in the art, a computing device has one or more memories such as memory 164, 164A, and each memory comprises any combination of volatile and non-volatile computer-readable media for reading and writing. Volatile computer-readable media includes, for example, random access memory (RAM). Non-volatile computer-readable media includes, for example, read only memory (ROM), magnetic media such as a hard-disk, an optical disk drive, a floppy diskette, a flash memory device, a CD-ROM, and/or the like. In some cases, a particular memory is separated virtually or physically into separate areas, such as a first memory, a second memory, a third memory, etc. In these cases, it is understood that the different divisions of memory may be in different devices or embodied in a single memory. The memory in some cases is a non-transitory computer medium configured to store software instructions arranged to be executed by a processor.

The computing devices illustrated herein may further include operative software found in a conventional computing device such as an operating system or task loop, software drivers to direct operations through I/O circuitry, networking circuitry, and other peripheral component circuitry. In addition, the computing devices may include operative application software such as network software for communicating with other computing devices, database software for building and maintaining databases, and task management software where appropriate for distributing the communication and/or operational workload amongst various processors. In some cases, the computing device is a single hardware machine having at least some of the hardware and software listed herein, and in other cases, the computing device is a networked collection of hardware and software machines working together in a server farm to execute the functions of one or more embodiments described herein. Some aspects of the conventional hardware and software of the computing device are not shown in the figures for simplicity.

When so arranged as described herein, each computing device may be transformed from a generic and unspecific computing device to a combination device comprising hardware and software configured for a specific and particular purpose.

Database structures, if any are present in the power beaming system embodiment 100 or in other embodiments, may be formed in a single database or multiple databases. In some cases hardware or software storage repositories are shared amongst various functions of the particular system or systems to which they are associated. A database may be formed as part of a local system or local area network. Alternatively, or in addition, a database may be formed remotely, such as within a "cloud" computing system, which would be accessible via a wide area network or some other network.

Input/output (I/O) circuitry and user interface (UI) modules include serial ports, parallel ports, universal serial bus (USB) ports, IEEE 802.11 transceivers and other transceivers compliant with protocols administered by one or more standard-setting bodies, displays, projectors, printers, keyboards, computer mice, microphones, micro-electro-mechanical (MEMS) devices such as accelerometers, and the like.

In at least one embodiment, devices such as transmitter portion 102 may communicate with other devices via communication over a network. The network may involve an Internet connection or some other type of local area network (LAN) or wide area network (WAN). Non-limiting examples of structures that enable or form parts of a network include, but are not limited to, an Ethernet, twisted pair Ethernet, digital subscriber loop (DSL) devices, wireless LAN, WiFi, Worldwide Interoperability for Microwave Access (WiMax), or the like.

In some cases, the memory 164, 164A is a non-transitory computer readable medium (CRM). The CRM is configured to store computing instructions executable by a processor 162 of the transmission unit 102 or processor 162A of the reception unit 108. The computing instructions may be stored individually or as groups of instructions in files. The files may include functions, services, libraries, and the like. The files may include one or more computer programs or may be part of a larger computer program. Alternatively or in addition, each file may include data or other computational support material useful to carry out the computing functions of a power beaming system embodiment 100.

Buttons, keypads, computer mice, memory cards, serial ports, bio-sensor readers, touch screens, and the like may individually or in cooperation be useful to an operator of the power beaming system embodiment 100. The devices may, for example, input control information into the system. Displays, printers, memory cards, LED indicators, temperature sensors, audio devices (e.g., speakers, piezo device, etc.), vibrators, and the like are all useful to present output information to the operator of the power beaming system embodiment 100. In some cases, the input and output devices are directly coupled to the transmission unit 102 and electronically coupled to a processor 162 or other operative circuitry. In other cases, the input and output devices pass information via one or more communication ports (e.g., RS-232, RS-485, infrared, USB, etc.)

As described herein, for simplicity, a user of the power beaming system embodiment 100 may in some cases be described in the context of the male gender. It is understood that a user can be of any gender, and the terms "he," "his," and the like as used herein are to be interpreted broadly inclusive of all known gender definitions.

Where a range of values is provided, it is understood that each intervening value, to the tenth of the unit of the lower limit unless the context clearly dictates otherwise, between the upper and lower limit of that range and any other stated or intervening value in that stated range is encompassed within the invention. The upper and lower limits of these smaller ranges may independently be included in the smaller ranges is also encompassed within the invention, subject to any specifically excluded limit in the stated range. Where the stated range includes one or both of the limits, ranges excluding either or both of those included limits are also included in the invention.

Unless defined otherwise, the technical and scientific terms used herein have the same meaning as commonly understood by one of ordinary skill in the art to which this invention belongs. Although any methods and materials similar or equivalent to those described herein can also be used in the practice or testing of the present invention, a limited number of the exemplary methods and materials are described herein.

As used in the present disclosure, the term "module" refers to an application specific integrated circuit (ASIC), an electronic circuit, a processor and a memory operative to execute one or more software or firmware programs, combinational logic circuitry, or other suitable components (i.e., hardware, software, or hardware and software) that provide the functionality described with respect to the module.

A processor (i.e., a processing unit), as used in the present disclosure, refers to one or more processing units individually, shared, or in a group, having one or more processing cores (e.g., execution units), including central processing units (CPUs), digital signal processors (DSPs), microprocessors, micro controllers, state machines, and the like that execute instructions. In the present disclosure, the terms processor in any of its grammatical forms is synonymous with the term controller.

In the present disclosure, memory may be used in one configuration or another. The memory may be configured to store data. In the alternative or in addition, the memory may be a non-transitory computer readable medium (CRM) wherein the CRM is configured to store instructions executable by a processor. The instructions may be stored individually or as groups of instructions in files. The files may include functions, services, libraries, and the like. The files may include one or more computer programs or may be part of a larger computer program. Alternatively or in addition, each file may include data or other computational support material useful to carry out the computing functions of the systems, methods, and apparatus described in the present disclosure.

As known by one skilled in the art, a computing device such as a computing server has one or more memories, and each memory comprises any combination of transitory and non-transitory, volatile and non-volatile computer-readable media for reading and writing. Volatile computer-readable media includes, for example, random access memory (RAM). Non-volatile computer-readable media includes, for example, read only memory (ROM), magnetic media such as a hard-disk, an optical disk drive, a flash memory device, a CD-ROM, and/or the like. In some cases, a particular memory is separated virtually or physically into separate areas, such as a first memory, a second memory, a third memory, etc. In these cases, it is understood that the different divisions of memory may be in different devices or embodied in a single memory. Some or all of the stored contents of a memory may include software instructions executable by a processing device to carry out one or more particular acts.

The terms, "real-time" or "real time," as used interchangeably herein and in the claims that follow, are not intended to imply instantaneous processing, transmission, reception, or otherwise as the case may be. Instead, the terms, "real-time" and "real time" imply that the activity occurs over an acceptably short period of time (e.g., over a period of microseconds, milliseconds, seconds, minutes or some other time frame as the context of the term's use implies), and that the activity may be performed on an ongoing basis (e.g., stopping the transmission of a high-flux power beam or field). An example of an activity that is not real-time is one that occurs over an extended period of time (e.g., hours, days, weeks, months, years, or some other time frame as the context of the term's use implies) or that occurs based on intervention or direction by a person or other activity.

Unless the context requires otherwise, throughout the specification and claims which follow, the word "comprise" and variations thereof, such as, "comprises" and "comprising" are to be construed in an open, inclusive sense, e.g., "including, but not limited to."

Reference throughout this specification to "one embodiment" or "an embodiment" and variations thereof means that a particular feature, structure, or characteristic described in connection with the embodiment is included in at least one embodiment. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

As used in this specification and the appended claims, the singular forms "a," "an," and "the" include plural referents unless the content and context clearly dictates otherwise. It should also be noted that the conjunctive terms, "and" and "or" are generally employed in the broadest sense to include "and/or" unless the content and context clearly dictates inclusivity or exclusivity as the case may be. In addition, the composition of "and" and "or" when recited herein as "and/or" is intended to encompass an embodiment that includes all of the associated items or ideas and one or more other alternative embodiments that include fewer than all of the associated items or ideas.

The headings and Abstract of the Disclosure provided herein are for convenience only and do not limit or interpret the scope or meaning of the embodiments.

The various embodiments described above can be combined to provide further embodiments. Aspects of the embodiments can be modified, if necessary to employ concepts of the various patents, application and publications to provide yet further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A power beaming transmission unit, comprising:
   power beam circuitry to wirelessly deliver electric power as a power beam from a first location to a second location, the first and second locations being remote from each other, the power beam circuitry arranged to provide an output beam having at least two power intensity levels, the at least two power intensity levels including a high-flux intensity level defining a hazardous illumination volume and a low-flux intensity level defining a safe illumination volume; and
   control circuitry, the control circuitry configured to:
      aim a transmitter of the power beam circuitry based on stored location information associated with a remote reception unit;
      after aiming the transmitter, direct the transmitter of the power beam circuitry to transmit a wide-angle output of a low-flux search beam during a first time window;
      detect, via a detector of the power beam circuitry, at least one returned signal as a reflection of the low-flux search beam during the first time window;
      based on the at least one returned signal, identify a location of the remote reception unit during the first time window;
      aim the transmitter of the power beam circuitry toward the identified location of the remote reception unit during the first time window; and
      direct the transmitter of the power beam circuitry to deliver a narrow-angle output of a high-flux power beam during a second time window.

2. A power beaming transmission unit according to claim 1 wherein the directing, detecting, identifying, and aiming are performed a plurality of times during the first time window.

3. A power beaming transmission unit according to claim 1 wherein directing the transmitter of the power beam circuitry to transmit the wide-angle output of the low-flux search beam during the first time window includes transmitting a narrow-angle output of the low-flux search beam in a determined sweeping pattern during the first time window.

4. A power beaming transmission unit according to claim 1, wherein the power beam circuitry includes:
   at least one wide-angle lens positioned in an optical path of the low-flux search beam during the first time period.

5. A power beaming transmission unit according to claim 1, wherein the detector includes:
   at least one photodetector, wherein the at least one returned signal crosses an intensity threshold sufficient to determine that the at least one returned signal is caused by the reflection of the low-flux search beam from a reflector associated with the remote reception unit.

6. A power beaming transmission unit according to claim 1, wherein the detector includes:
   at least one photodetector, wherein the transmitter of the power beam circuitry is directed to transmit the wide-angle output of the low-flux search beam during the first time window according to a selected time pattern, and wherein the at least one returned signal includes a plurality of light reflections corresponding to the selected time pattern.

7. A power beaming transmission unit according to claim 1, wherein the detector includes:
   at least one image sensor, wherein the at least one returned signal includes at least one image captured by the image sensor of volume illuminated by the wide-angle output of the low-flux search beam during the first time window, wherein the control circuitry is further configured to identify a determined pattern in the at least one image, the determined pattern corresponding to a reflector pattern associated with the remote reception unit.

8. A power beaming transmission unit according to claim 1, wherein the detector includes:
   at least one transceiver, the at least one transceiver arranged to receive directional information from the remote reception unit during the first time window, the directional information based on the reception unit receiving at least a portion of the transmitted wide-angle output of the low-flux search beam during the first time window.

9. A power beaming transmission unit according to claim 1, wherein the detector includes:
   at least one transceiver, wherein the transmitter of the power beam circuitry is directed to dynamically aim the transmitter of the power beam circuitry in response to feedback information received from the remote reception unit.

10. A power beaming method executed by power beam circuitry, the power beam circuitry arranged to wirelessly deliver electric power as a power beam from a first location to a second location, the first and second locations being remote from each other, the power beam circuitry arranged to provide an output beam having at least two power intensity levels, a high-flux intensity level defining a hazardous illumination volume and a low-flux intensity level defining a safe illumination volume, the method comprising:
   transmitting, with a power beam transmitter, a low-flux search beam over a wide-angle during a first time window, wherein transmitting the low-flux search beam over the wide-angle during the first time window includes transmitting the low-flux search beam over a narrow-angle in a determined sweeping pattern during the first time window;
   detecting at least one returned reflection of the low-flux search beam during the first time window;
   identifying a location of a remote reception unit based on information contained in the at least one returned reflection;
   aiming the power beam transmitter toward the identified location of the remote reception unit; and focusing a high-flux power beam toward the identified location of the remote reception unit during a second time window.

11. A power beaming method according to claim 10 wherein before transmitting, with the power beam transmitter, the low-flux search beam over the wide angle during the first time window, aiming the power beam transmitter based on stored location information associated with the remote reception unit.

12. A power beaming method according to claim 10, wherein transmitting the low-flux search beam over the wide-angle during the first time window includes positioning a wide-angle lens in an optical beam path of the low-flux search beam.

13. A power beaming method according to claim 10, wherein transmitting the low-flux search beam over the wide-angle during the first time window includes transmitting according to a selected time pattern, and wherein identifying the location of the remote reception unit based on information contained in the at least one returned reflection includes recognizing the selected time pattern in the at least one returned reflection.

14. A power beaming method according to claim 10, wherein detecting at least one returned reflection of the low-flux search beam during the first time window includes capturing, with at least one image sensor at least one image of a volume illuminated by the wide-angle output of the low-flux search beam during the first time window.

15. A power beaming system, comprising:
a power beam reception unit, the power beam reception unit including:
a power conversion array, the power conversion array arranged to capture at least a portion of a power beam; and
a power supply circuit, the power supply circuit arranged to convert flux from the captured portion of the power beam to electric power; and
a power beam transmission unit, the power beam transmission unit including:
a power beam transmitter circuit arranged to transmit a low-flux search beam during a first time window according to a selected time pattern, and further arranged to transmit a high-flux power beam during a second time window; and
a location detection circuit arranged to identify a location of the reception unit in association with the power beam transmitter circuit transmitting the low-flux search beam during the first time window, wherein the location detection circuit includes at least one photodetector arranged to detect at least one returned signal that includes a plurality of light reflections corresponding to the selected time pattern.

16. A power beaming system according to claim 15, wherein the power beam transmitter circuit arranged to transmit the low-flux search beam during the first time window is further arranged to transmit the low-flux search beam over a narrow-angle in a determined sweeping pattern during the first time window.

17. A power beaming system according to claim 15, wherein the power beam reception unit includes:
a plurality of retro-reflectors arranged in a determined pattern.

18. A power beaming system according to claim 15, wherein the power beam is a laser-based power beam.

19. A power beaming system according to claim 15, wherein the power conversion array of the power beam reception unit includes:
a photovoltaic array, the photovoltaic array arranged to determine a focusing-status value representing an intensity of the low-flux search beam captured by the photovoltaic array during the first time window, and wherein the power beam reception unit is arranged to communicate the focusing-status value to the power beam transmission unit during the first time window.

20. A power beaming system according to claim 15, wherein the power beam transmission unit includes:
at least one first configuration of optical elements positioned in an optical path of the low-flux search beam during the first time period, and at least one second configuration of optical elements positioned in an optical path of the high-flux power beam during the second time period, wherein the first configuration of optical elements produces a high-divergence beam active during the first time period, and wherein the second configuration of optical elements produces a low-divergence beam active during the second time period, wherein divergence of the high-divergence beam is higher than divergence of the low-divergence beam.

* * * * *